US007100131B2

(12) United States Patent
Honda

(10) Patent No.: US 7,100,131 B2
(45) Date of Patent: Aug. 29, 2006

(54) EVALUATION METHOD OF SEMICONDUCTOR DEVICE, MANUFACTURING METHOD OF THE SEMICONDUCTOR DEVICE, DESIGN MANAGEMENT SYSTEM OF DEVICE COMPRISING THE SEMICONDUCTOR DEVICE, DOSE AMOUNT CONTROL PROGRAM FOR THE SEMICONDUCTOR DEVICE, COMPUTER-READABLE RECORDING MEDIUM RECORDING THE PROGRAM, AND DOSE AMOUNT CONTROL APPARATUS

(75) Inventor: Tatsuya Honda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 418 days.

(21) Appl. No.: 10/700,719

(22) Filed: Nov. 5, 2003

(65) Prior Publication Data

US 2004/0101989 A1    May 27, 2004

(30) Foreign Application Priority Data

Nov. 7, 2002  (JP) ............................. 2002-324460
Nov. 22, 2002  (JP) ............................. 2002-340069

(51) Int. Cl.
*G06F 17/50* (2006.01)
*H01L 21/04* (2006.01)
*H01L 21/425* (2006.01)

(52) U.S. Cl. ........................... 716/4; 438/510; 438/514

(58) Field of Classification Search ............ 716/4; 438/45, 276, 307, 371, 418, 433, 447, 449, 438/510, 514

See application file for complete search history.

(56) References Cited

U.S. PATENT DOCUMENTS 5,442,174 A   8/1995  Kataoka et al.
5,502,305 A   3/1996  Kataoka
5,521,377 A   5/1996  Kataoka et al.
6,083,272 A * 7/2000  Nistler et al. ................... 716/4
6,493,848 B1* 12/2002  Mattia ........................... 716/4

FOREIGN PATENT DOCUMENTS

JP           07-66258            3/1995

OTHER PUBLICATIONS

Wen-Chin Lee et al., "Observation of Reduced Poly-Gate Depletion Effect for Poly-$Si_{0.8}Ge_{0.2}$-Gated NMOS Devices", Electrochemical and Solid-State Letter, 1(1), 1998, pp. 58-59.
C.J. Kang et al., "Charge trap dynamics in a $SiO_2$ layer on Si by scanning capacitance microscopy", Applied Physics Letters vol. 74, No. 13, Mar. 29, 1999, pp. 1815-1817.

* cited by examiner

*Primary Examiner*—Paul Dinh
(74) *Attorney, Agent, or Firm*—Nixon Peabody LLP; Jeffrey L. Costellis

(57) ABSTRACT

There is provided a new method of obtaining the dopant activation rate of a device accurately and simply in a different way from a method of obtaining a carrier density with use of a Hall measurement or CV measurement, and also provided a production method of a device performed with a proper threshold voltage control, that is, a dose amount control, according to the obtained activation rate. The inventor devised a method in which the activated dopant density (first dopant density) in a semiconductor film is obtained from the threshold voltage and the flat band voltage of a device, then the dopant activation rate is obtained from the ratio of the obtained activated dopant density to the added dopant density (second dopant density) obtained by SIMS analysis. The invention allows easily obtaining the dopant activation rate in the channel region and the impurity region of the device.

6 Claims, 12 Drawing Sheets

FIG.1A

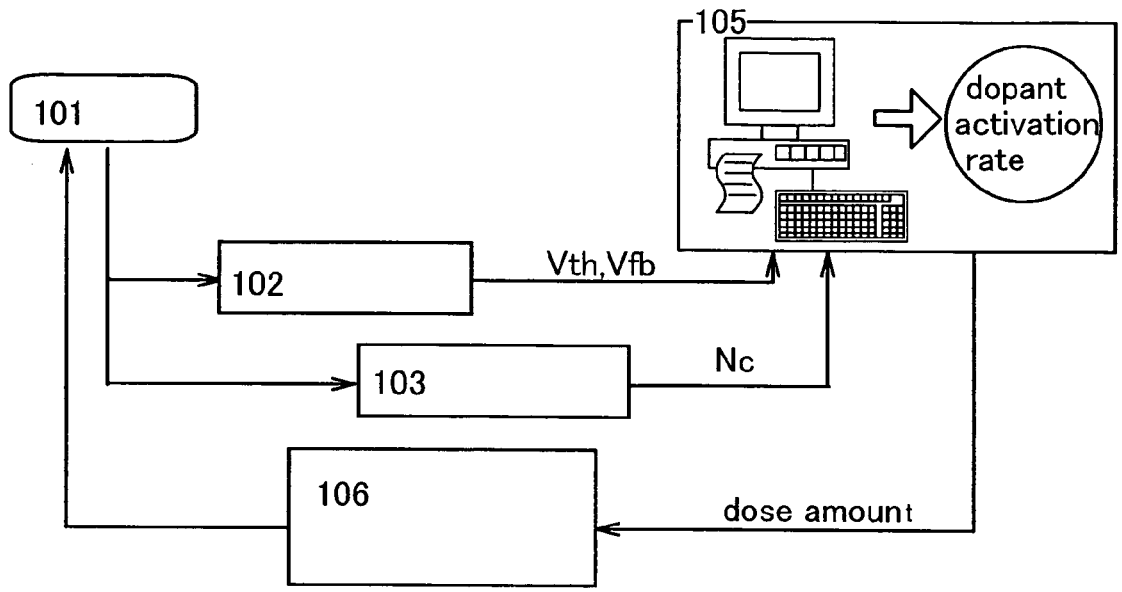

FIG.1B

| obtaining a threshold voltage(Vth) and a flat band voltage(Vfb) from an electric characteristics (Vg-Id curve) of a measurement sample |
|---|
| obtaining an activated dopant density(Nd) from the threshold voltage(Vth) and the flat band voltage (Vfb) using theoretical formulas according to the present invention |
| computing a dopant activation rate from the dopant density(Nd) obtained and a dopant density(Nc) obtained by SIMS |
| controlling a dose amount of a doping device according to the dopant activation rate |

FIG.2A

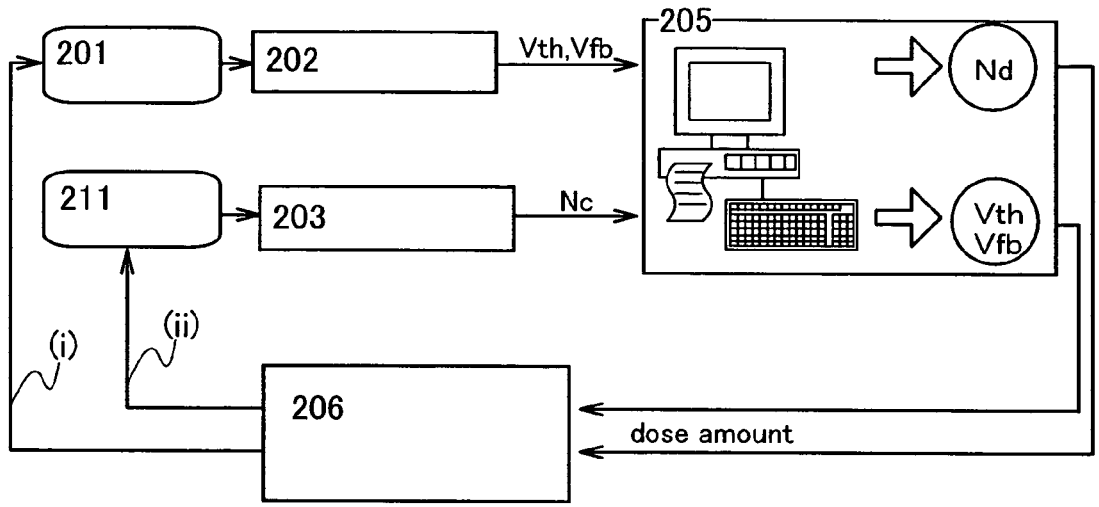

FIG.2B (i)

| obtaining a threshold voltage(Vth) and a flat band voltage(Vfb) from an electric characteristics (Vg-Id curve) of a measurement sample |

↓

| comparing a dopant activation rate data obtained by theoretical formulas according to the invention and the threshold voltage(Vth) and the flat band voltage(Vfb) |

↓

| obtaining a dopant density(Nd) |

↓

| controlling a dose amount of a doping device according to the dopant density |

(ii)

| obtaining a dopant density(Nc) by SIMS analysis of a measurement sample |

↓

| comparing a dopant activation rate data obtained by theoretical formulas according to the invention and the dopant density(Nc) |

↓

| obtaining a threshold voltage(Vth) and a flat band voltage(Vfb) |

↓

| controlling a dose amount of a doping device according to the threshold voltage and the flat band voltage |

FIG.3A
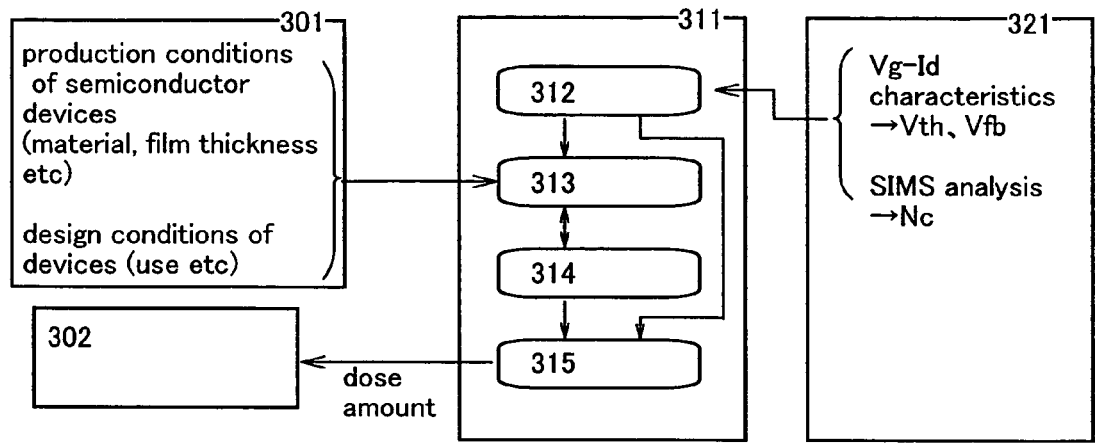
FIG.3B
(i)
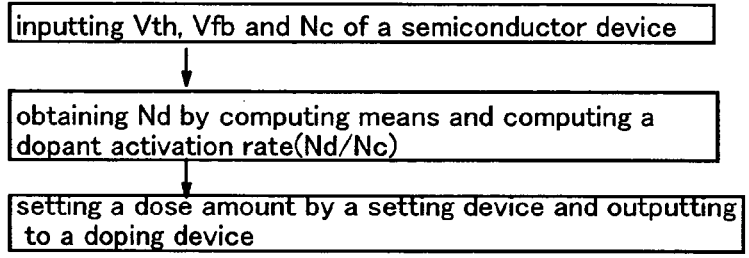
(ii)
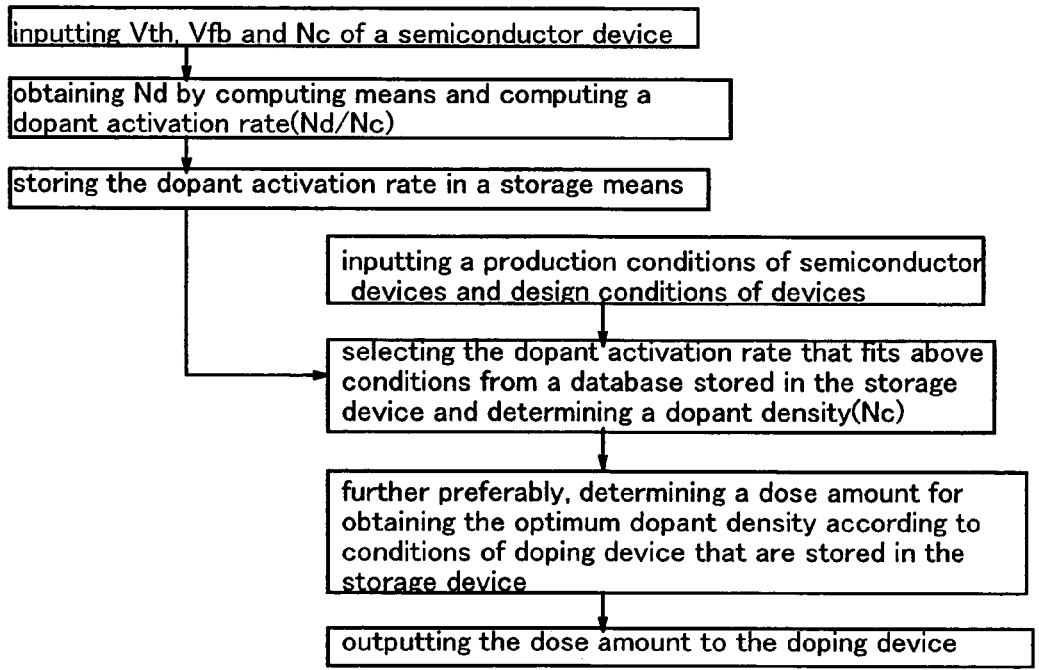

FIG.4A
(i)
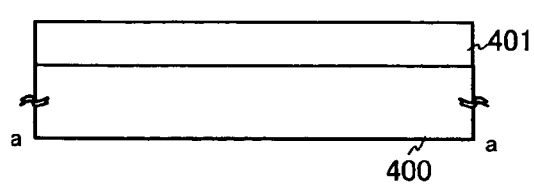
(ii)
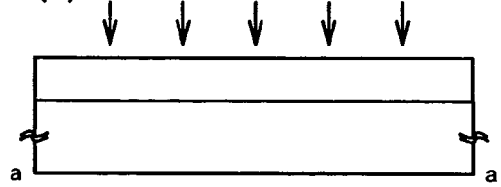
(iii)
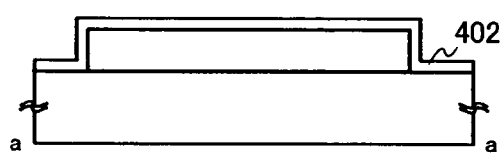
(iv)
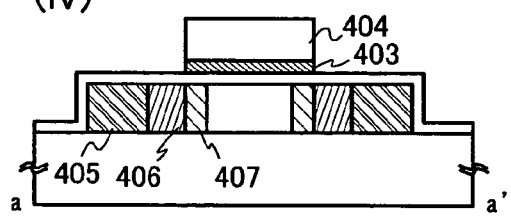
↓
complete
FIG.4B
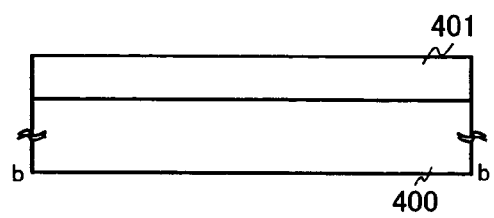
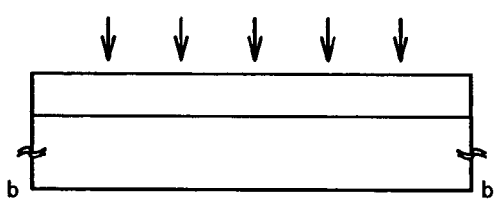
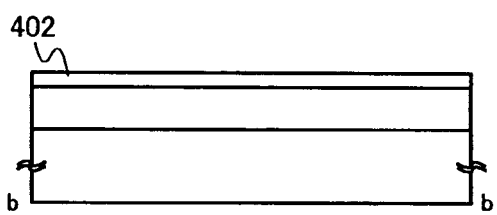
↓
complete

FIG.9
sample 1
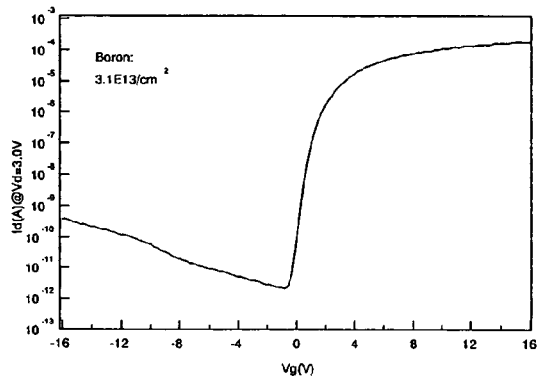
sample 2
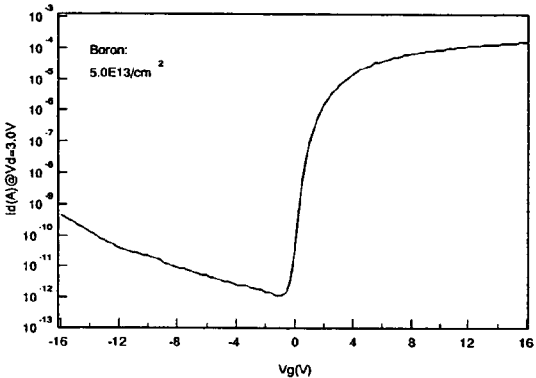
sample 3
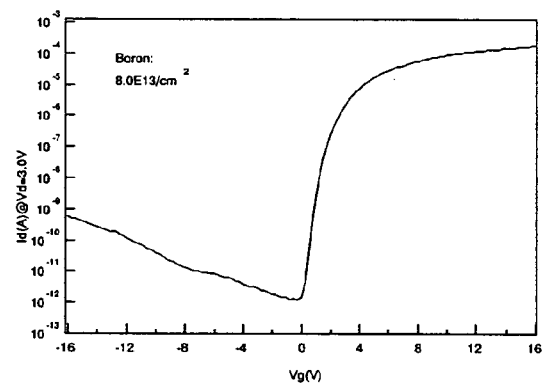
sample 4
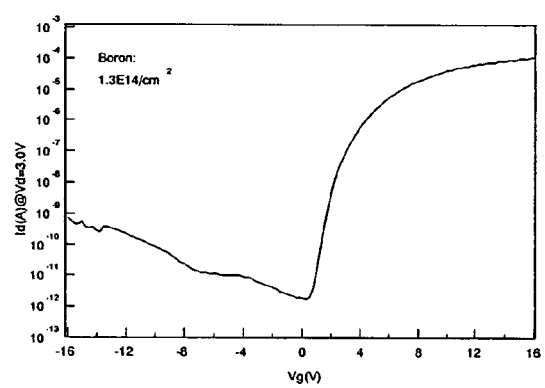
sample 5
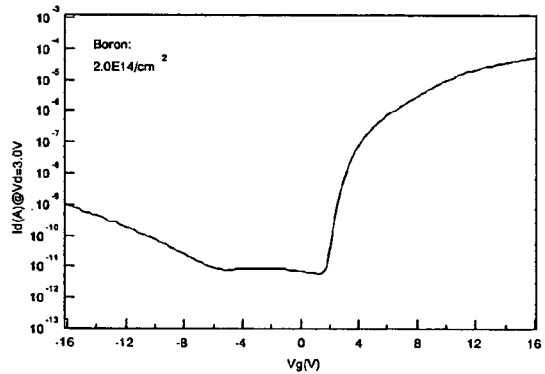
sample 6
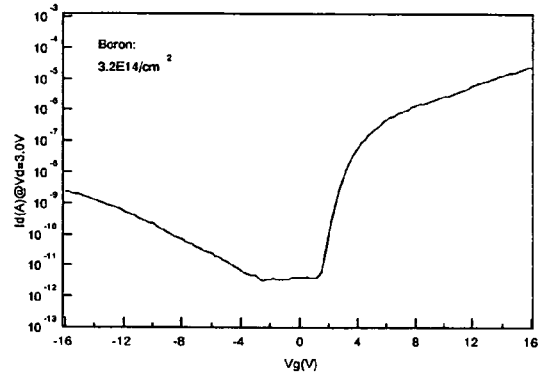

EVALUATION METHOD OF SEMICONDUCTOR DEVICE, MANUFACTURING METHOD OF THE SEMICONDUCTOR DEVICE, DESIGN MANAGEMENT SYSTEM OF DEVICE COMPRISING THE SEMICONDUCTOR DEVICE, DOSE AMOUNT CONTROL PROGRAM FOR THE SEMICONDUCTOR DEVICE, COMPUTER-READABLE RECORDING MEDIUM RECORDING THE PROGRAM, AND DOSE AMOUNT CONTROL APPARATUS

BACKGROUND OF THE INVENTION

1. Field of the Invention

The present invention relates to a device comprising a semiconductor device, particularly relates to an evaluation method of the dopant density and the dopant activation rate in a semiconductor film, and provides a design management system (production management system) on which these things are taken into account. Further, the invention provides a program to make a computer obtain the dopant activation rate and control the dose amount.

2. Description of the Related Art

In a field effect transistor (hereinafter referred to as a 'FET'), a thin film transistor (hereinafter referred to as a 'TFT'), which is an example of FETs, and other semiconductor devices, the threshold voltage is an important parameter that decides the operating point. The threshold voltage is decided by the factors such as the activation rate of added dopant (impurity), (hereinafter referred to as the 'dopant activation rate), and the distribution of carriers concentration (hereinafter referred to as 'carrier density').

In other words, it is necessary to control the dopant activation rate and the carrier density so that semiconductor devices obtain predetermined characteristics. The dopant activation rate is represented by the ratio of the amount of dopant which is actually activated to the amount of dopant which is added to a semiconductor film. The carrier density is the amount of carriers that actually flow in the channel region, which also varies depending on the presence of an applied voltage. Particularly, when the dopant activation rate is 100%, the dopant density and the carrier density are equal.

Conventionally, the carrier density is obtained by the Hall measurement, the CV measurement (capacitance measurement), or SIMS analysis.

As an example using SIMS analysis, which is a measurement of the above carrier density, there is a method such that: primary ions are emitted onto the surface of a conductive impurity-doped semiconductor film under the condition that the surface thereof is charged with electricity; the strength of the secondary ions having a specific energy emitted from the surface is sequentially measured with the elapse of emitting time of the primary ions; and, from the concentration of carriers corresponding to the strength of the secondary ions and the etching amount of the semiconductor film corresponding to the time of emitting of the primary ions, the carrier distribution in the depth direction in the semiconductor film is obtained (refer to Japanese Patent Laid-Open No. H7-66258).

It is difficult, however, to measure a thin film such as a TFT or SOI membrane by the Hall measurement. This is because, as the film is thinner, the resistance of the film is greater, and the Hall current is smaller, which makes it very difficult to obtain the carrier density. Particularly, in the case of a semiconductor device formed on a glass substrate, the CV measurement which requires grounding of the substrate is useless.

Further, the Hall measurement and the CV measurement require a specific TEG (Test Element of Groups) for measurement that is different from a device, and the carrier density of a TEG is measured. Since the TEG is produced under conditions different from the thermal history of the actual device process, it is possible that the carrier density and the dopant activation rate are different from those in the device.

Still further, with an actual device, the dopant density contributing to carriers (that is the activated dopant density) changes a lot with the state of the semiconductor film due to the high defect density in the film when the semiconductor film is non-crystal or polycrystal.

On the other hand, even a carrier density obtained from a singlecrystal wafer having a small defect density is not necessarily the same as the value of the actual device. This is because even if the dopant activation rate of the TEG is obtained by the Hall measurement, the CV measurement, or SIMS analysis, since the actual device goes through several thermal processes before completion, it is highly possible that the above obtained dopant activation rate is different from that in the semiconductor film of the device.

Further, to obtain the carrier density with high accuracy using the Hall measurement or the CV measurement, it is necessary to measure a maximum possible capacitance (in case of the CV measurement) or a maximum possible Hall current (in case of the Hall measurement). Therefore, the TEG for the Hall measurement or the CV measurement is much greater compared to the device. Consequently, since the obtained carrier density is an average value in a wide region, the dispersion of the values in a microscopic region cannot be evaluated.

SUMMARY OF THE INVENTION

To solve the problem, the invention provides a new method of obtaining a dopant activation rate of a device accurately and easily. The invention provides a production method of a device with proper threshold voltage control, that is, control of the dose amount, according to the obtained activation rate.

The invention also provides a design management system (production management system) to carry out efficient designing of devices having desired characteristics by setting the doping amount of a doping system to a proper value.

Still further, the invention provides a program to obtain a dose amount in a short time with a constant result independently of the experience of the executor.

A device means a set of a plurality of semiconductor devices, represented by FET, having a certain function (shift resistors, driving transistors, etc.). A set of a plurality of the devices constructs a liquid crystal display apparatus, an EL display apparatus, or another display apparatus.

Taking the above problems into account, the inventor devised a method of obtaining the dopant activation rate in which the dopant density (first dopant density) of activated dopant in a semiconductor film is obtained from the threshold voltage and the flat band voltage of a device, then the dopant activation rate is obtained from the ratio of the above obtained dopant density (first dopant density) of the activated dopant to the added dopant density (second dopant density) that is obtained by SIMS analysis (Secondary Ion Mass Spectrometry).

Instead of SIMS analysis, physical analysis or chemical analysis by which the added dopant density can be obtained may be applied. For example, by peeling the film which is added with dopant and melting it in a solvent, the added dopant density can be obtained from the mass ratio.

Specifically, in the invention, the threshold voltage and the flat band voltage are obtained from the Vg-Id (the drain current for the gate voltage) curve of a device. Then, using theoretical formulas by the invention and the activated dopant density to obtain is defined as a variable, the dopant density is obtained such that the above variable accords with the difference between the threshold voltage and the flat band voltage obtained from the Vg-Id curve. Thus decided value is the activated dopant density. Next, in the invention, the dopant activation rate is obtained by dividing the activated dopant density by the added dopant density which is obtained by SIMS analysis.

The flat band voltage is defined by the gate voltage at the time when the energy band in semiconductor becomes flat in Vg-Id characteristics of the device. If the gate voltage is increased from the flat band voltage positively or negatively, then the band goes into inversion and a current begins to flow. Therefore, the flat band voltage can be recognized as the inflection between off-current and on-current on the Vg-Id curve.

According to the invention, the dopant activation rate can be obtained not only for a semiconductor film, that is, a channel region, but also for the source region, the drain region, the LDD region, and the like (hereinafter, totally referred to as 'the impurity region'). For example, the dopant activation rate of the LDD region can be obtained as follows.

First of all, dopant is implanted into a semiconductor film the same as into the LDD region. For example, after an insulating film is formed on the semiconductor film, dopant is implanted, then the insulating film on the semiconductor film is removed by etching, further, the semiconductor film is patterned to become a device of a desired size, and a gate insulating film and a gate electrode are formed on the semiconductor film to produce a semiconductor device.

Then, from the Vg-Id curve of the produced semiconductor device, the threshold voltage and the flat band voltage are obtained, and thereby the activated dopant density in the LDD region can be obtained. Further, if the activated dopant density is coupled with SIMS analysis data, the dopant activation rate in the source region or the drain region can be obtained.

Also, the dopant activation rate and others obtained from theoretical formulas of the invention may be databased. By comparison of the dopant activation rate and others with the threshold voltage and the flat band voltage in the channel region or the impurity region of the semiconductor device constructing the device, information on the added dopant density can be obtained. In reverse, from the added dopant density and the dopant activation rate, the threshold voltage and the flat band voltage can be estimated. By databasing the dopant activation rate and others as such, the dose amount can be set more quickly compared to known methods in which a predetermined dose amount is set from a plurality of samples.

By the above evaluation method according to the invention, the dopant activation rate in the channel region and the impurity region of a device can be easily obtained. In other words, according to the invention, it is possible to use not a TEG for measurement but the actual device. Also, since the dopant activation rate in a region as small as several micrometers can be obtained, dispersion of the values in a microscopic region can be evaluated. Further, the measurement method according to the invention allows evaluation on a device with a thin film.

Still further, according to the invention, a device design management system that determines a proper doping amount (dose amount), according to the obtained dopant activation rate, can be achieved. For example, a dopant density that maximizes the dopant activation rate can be obtained, and then the dose amount can be fed back to the doping system. Further, when repairing or starting the doping system, the dopant activation rate can be used to make a fine adjustment of the dose amount.

Depending on the purpose of evaluation, the dopant activation rate or the activated dopant density may be used. For example, the dopant activation rate can be used for evaluation of the quality of a semiconductor film, and the activated dopant density can be used for obtaining the dose amount. However, since it is possible that time is not taken into account by merely setting the dose amount, it is preferable to use the dopant activation rate for efficient doping.

A device that is formed by controlling the dose amount to be a proper amount, according to the invention, has higher electric characteristics compared to devices produced by conventional method. Particularly, by the device design management system according to the invention, devices in which dispersion of the threshold voltage is reduced can be provided. In other words, the invention allows manufacturing of products with the efficiency of mass production.

Further, the dispersion of the threshold voltage among the semiconductor devices in the same substrate can be reduced. Although if the activation rate is low, the threshold voltage is sensitive to the effects of the factors (heating process and the like), dispersion of the threshold voltage can be reduced by controlling the dopant activation rate to be high to a certain degree, thereby reducing the dispersion of the threshold voltage described above.

Still further, a method of the invention can be taken as a system or a program. The program can be recorded in a computer-readable recording medium such as a hard disk, a CD-ROM, an optical recording device, or a magnetic storage device.

Semiconductor devices herein include field effect type transistors represented by TFTs and FETs, and junction type transistors such as bipolar transistors. Junction type transistors require field effect type transistors for measurement.

As described above, the invention provides an accurate and simple evaluation method for improving stability and reliability of electric characteristics of semiconductor devices. The invention also provides a liquid crystal display apparatus, an EL display apparatus, and other display apparatuses which are reliable and equipped with devices according to the invention.

BRIEF DESCRIPTION OF THE DRAWINGS

FIGS. 1A to 1B are diagrams showing an example of a design management system according to the invention;

FIGS. 2A to 2B are diagrams showing another example of a design management system according to the invention;

FIGS. 3A to 3B are diagrams showing an example of a computer system according to the invention;

FIGS. 4A to 4B are diagram showing a measurement sample according to the invention;

FIG. 9 is a diagram showing another experimental result according to the invention;

DETAILED DESCRIPTION OF THE PREFERRED EMBODIMENTS

Embodiment Mode 1

Figure 5:
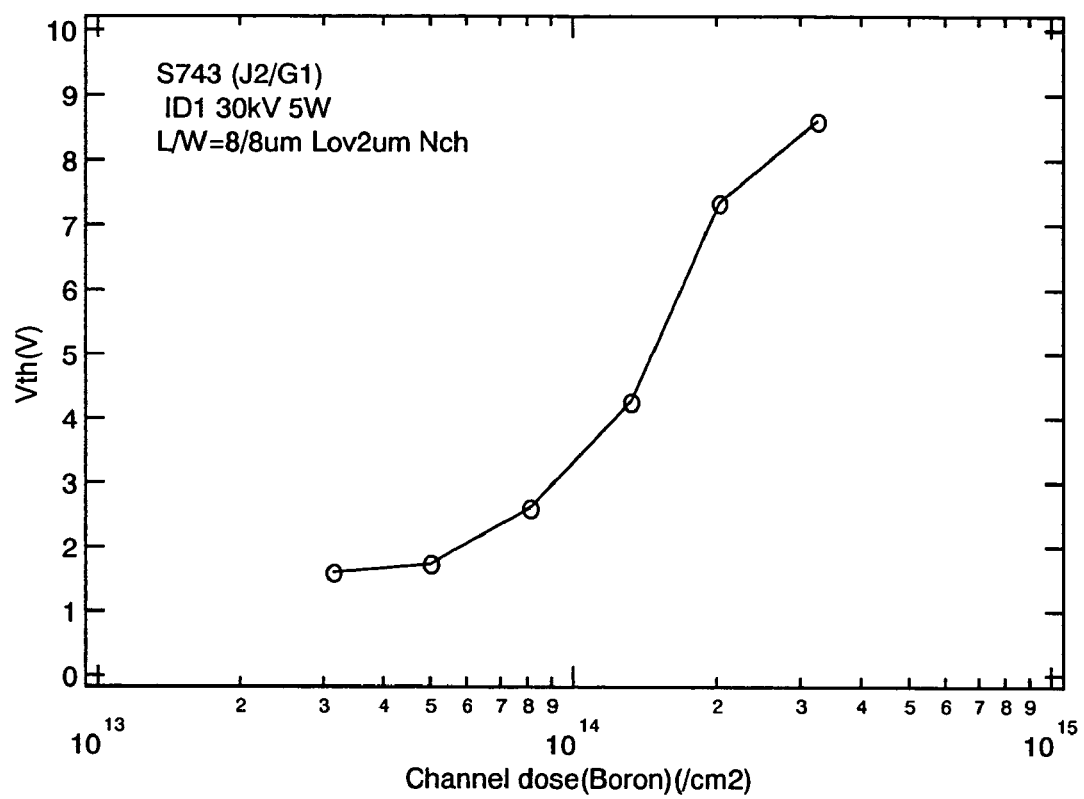
FIG. 5 is a diagram showing an experimental result according to the invention.

In the present embodiment mode, theoretical formulas according to the invention will be described, taking an example, first, of a partially depleted FET, which is possible in the case that the thickness of the activated layer is relatively large. Partial depletion means the state that an activated layer gets depleted only partially even under a strong-inversion condition.

Vth and Vfb denote the threshold voltage and the flat band voltage of an FET, respectively. Further, Cox denoted the capacitance of the insulating film of the FET, and Q denotes the electric charge that is induced in the depletion layer. Still further, Vs denotes the surface potential. Then, the following formula is valid.

$$Vg - Vfb = Q/Cox + Vs \quad (1)$$

Vg denotes, herein, the voltage applied to the gate electrode of the FET. From this formula, if Vg=Vth, the following formula is valid.

$$Vth = Vfb + Q/Cox + Vs \quad (2)$$

$$Q = e \cdot Nd \cdot Wmax \quad (3)$$

$$Vs = (e \cdot Nd \cdot Wmax^2)/(2\epsilon O \cdot \epsilon Si) = 2Vf \quad (4)$$

Nd denotes the activated dopant density, and e denotes the electron charge. Wmax denotes the width of the depletion layer. Potential Vf is given by the difference between Fermi level Ef in a bulk region which is off the insulating film boundary surface and the intrinsic Fermi level Ei, and represented by the formula (5).

$$Vf = (Ef - Ei)/e \quad (5)$$

Further, denoting the intrinsic carrier density by ni, the following formula is valid.

$$Nd = ni \cdot \exp((Ef - Ei)/kT) \quad (6)$$

From formulas (4), (5), and (6), the following formula is obtained.

$$Vs = (2kT/e) \cdot \ln(Nd/ni) = (e \cdot Nd \cdot Wmax^2)/(2\epsilon O \cdot \epsilon Si) \quad (7)$$

The vacuum permittivity and the relative permittivity of a semiconductor are denoted by $\epsilon 0$ and $\epsilon Si$, respectively. From formula (7), Wmax is represented by the flowing formula.

$$Wmax = [(4\epsilon O \cdot \epsilon Si \cdot kT)/(e^2 \cdot Nd) \cdot \ln(Nd/ni)]^{1/2} \quad (8)$$

From formulas (2), (3), (7) and (8), the following formula is obtained.

$$Vth - Vfb = (e \cdot Nd/Cox) \cdot [(4\epsilon O \cdot \epsilon Si \cdot kT)/(e^2 \cdot Nd) \cdot \ln(Nd/ni)]^{1/2} + (2kT/e) \cdot \ln(Nd/ni) \quad (9)$$

From formula (9), it will be understood that the activated dopant density Nd can be obtained if values are given to Vth and Vfb. However, formula (9) cannot be solved analytically and is necessary to be solved numerically. Since Nd and ni are of great values indicated by indexes, calculation will be easier if the formula is modified as the following formula in numerical calculation to reduce the dimension of the variables.

$$Vth - Vfb = (e \cdot ni/Cox)(Nd/ni) \cdot [(4\epsilon O \cdot \epsilon Si \cdot kT)/(e^2 \cdot (Nd/ni) \cdot ni) \cdot \ln(Nd/ni)]^{1/2} + (2kT/e) \cdot \ln(Nd/ni) \quad (10)$$

In actual calculation, Nd/ni is set as a variable, and Nd/ni is obtained such that the left side and the right side of formula (10) become an equal value.

Next, theoretical formulas, according to the invention, for a fully depleted FET, which is valid in the case that the film thickness of an activated layer is small, will be described. In a fully depletion type, the width of the depletion layer under an inversion condition is equal to the thickness of the activated layer. Denoting the thickness of the activated layer by tSi, the following formula is valid in the case of a fully depleted FET.

$$Vth - Vfb = (e \cdot Nd \cdot tSi)/Cox + 2Vf = (e \cdot (Nd/ni) \cdot ni \cdot tSi)/Cox + (2kT/e) \cdot \ln(Nd/ni) \quad (11)$$

In the above, it is necessary to use different calculation formulas depending on the thickness of the activated layer. Determination as to whether a FET is a partial depletion type or a fully depletion type can almost be made, using the following formulas, that are: if $$tSi > [(4\epsilon O \cdot \epsilon Si \cdot Vf)/(e \cdot Nd)]^{1/2}$$

is valid, then the FET can be determined to be a partial depletion type, and if $$tSi < [(4\epsilon O \cdot \epsilon Si \cdot Vf)/(e \cdot Nd)]^{1/2}$$

is valid, then the FET can be determined to be a fully depletion type.

As described above, from the difference between the threshold voltage and the flat band voltage of a semiconductor device, the activated dopant density (Nd) can be obtained, and from the activated dopant density and the added dopant density, the dopant activation rate can be obtained. To obtain the activated dopant density on an actual semiconductor, a correction term is taken into account in the above formula in some cases.

The threshold voltage Vth necessary for calculation can be obtained from the Vg-Id curve of the FET. The drain current in the saturated region according to a gradual channel approximation is given by the following formula.

$$Id = (W/2L) \cdot Cox \cdot uFE \cdot (Vg - Vth)^2 \quad (12)$$

W and L respectively denote the width and the length of the channel region. Cox and uFE denote the capacitance of the insulating film and the field effect mobility respectively. From formula (12), it will be understood that if both sides of formula (12) are squared, the square of Id and Vg are in a linear relationship. The intersection of the linear line and X axis gives the threshold voltage Vth.

The above formula, and the threshold voltage (Vth) and the flat band voltage (Vfb) which are obtained from the electric characteristics (Vg-Id curve) of the device, determine the dopant density (Nd). From this dopant density (Nd) and the dopant density (Nc) obtained by SIMS analysis, the dopant activation rate (Nd/Nc) can be easily obtained.

Also, dopant activation rates obtained according to the invention, the heating conditions thereof, and doping conditions may be databased to obtain the dopant density (Nc) for a measurement sample whose threshold voltage and flat band voltage have been obtained.

Further, for a measurement sample whose dopant density (Nc) has been obtained, the threshold voltage and the flat band voltage of a FET produced according to the measured sample can be obtained on condition that heating conditions and doping conditions of respective measurement samples are the same.

Although in the present embodiment, an example has been described using a FET, the invention can be applied to any device, a TFT for example, for which the theoretical formulas according to the invention are valid.

Embodiment Mode 2

In the present embodiment mode, a design management system that feeds back a dopant activation rate obtained as in the embodiment mode 1 to a process of producing devices will be described with reference to FIGS. 1A and 1B.

FIGS. 1A and 1B are a construction diagram of the design management system and a flowchart thereof, respectively.

First of all, a semiconductor device to be a device is produced, and then, this device is measured as a measurement sample 101 by a Vg-Id characteristics measurement instrument 102 and a SIMS analysis apparatus 103. Then, a threshold voltage (Vth) and a flat band voltage (Vfb) which are obtained from Vg-Id characteristics are input to a computer 105, and the dopant density (Nd) is computed according to theoretical formulas according to the invention. Further, from a dopant density (Nc) obtained by SIMS analysis and the dopant density (Nd) obtained by the theoretical formulas, a dopant activation rate is computed by the computer 105.

Next, according to the obtained dopant activation rate, an optimum dose amount (for example, a dose amount with the highest activation rate) in which the threshold voltage is taken into account is determined, and a doping system 106 is controlled such that the dose amount is to be the determined amount. In other words, the dopant activation rate is fed back to the dose amount of the doping system.

Further, a device simulator may be provided between the computer 105 and the doping system 106. For calculation of the device size necessary for a circuit, the device simulator requires input of the dopant density (Nd) in the channel region, the source region, or the drain region. The dopant density (Nd) can be obtained from the threshold voltage and the flat band voltage. The dopant density in a LDD section which is necessary for improving the reliability of the device is calculated by the device simulator, a dose amount which sets the dopant density to a desired value is searched by a personal computer for database, and the obtained dose amount is transmitted to the doping system, thereby making it possible to efficiently produce a reliable device.

The design management system in the present embodiment mode can be implemented, using the dopant activation rate in either the channel region or the impurity region.

As described above, by determining the dose amount from the dopant activation rate, it is possible to efficiently produce a device which is controlled for an optimum threshold voltage.

Embodiment Mode 3

In the present embodiment mode, differently from the embodiment mode 2, a design management system in the case of stored dopant activation rates as a database will be described with reference to FIGS. 2A and 2B.

FIG. 2A is a construction diagram of the design management system, and FIG. 2B is a flowchart of the design management system. The present embodiment mode can be divided into two routes (i) and (ii) depending on which of Vg-Id characteristics measurement and SIMS analysis has been carried out for a measurement sample.

First, the route (i) will be described. First, measurement is carried out on a measurement sample A 201 comprising a semiconductor device, using a Vg-Id characteristics measuring instrument 202. Then, a computer 205 computes the doping density (Nd) from the obtained threshold voltage and the obtained flat band voltage. Further, stored dopant activation rates and the doping density (Nd) are compared by the computer 205. As a result, the dopant density (Nc) of the measurement sample A 201 is obtained.

According to the obtained dopant density (Nc) and the dopant activation rate then, the dose amount of a doping system is controlled. In other words, the doping density (Nc) is fed back to the dose amount of the doping system.

The route (ii) is for the case of performing measurement on a measurement sample B211 comprising a semiconductor device, using a SIMS analyzing apparatus 203. The dopant density (Nc) obtained by SIMS analysis and the stored dopant activation rates are compared by the computer 205. As a result, the dopant density (Nd) of the measurement sample B211, and the threshold voltage or the flat band voltage are obtained.

According to the obtained dopant density (Nd) and the dopant activation rate then, the dose amount of the doping system is controlled. In other words, the threshold voltage and the flat band voltage are fed back to the dose amount of the doping system.

A device simulator may be provided between the computer 205 and the doping system 206 as well as in the embodiment mode 1.

As described above, with respect to a plurality of semiconductor devices, the threshold voltage, the flat band voltage, the dopant densities (Nd, Nc), and the dopant activation rate can be databased. As a result, an optimum dose amount can be determined by performing either Vg-Id characteristic measurement or SIMS analysis on the semiconductor devices.

Embodiment Mode 4

In the present embodiment mode, a computer system for controlling the dose amount will be described with reference to FIGS. 3A and 3B.

Various types of computers including personal computers, workstations, and mainframe computers can be used as a computer of the computer system described above. The computer is provided with hardware devices, which are equipped on common computers, such as a central processing unit (CPU), a main memory unit (RAM), a coprocessor, an image accelerator, a cash memory, an input-output control device (I/O), and the like. Further, an external storage device such as a hard disk device, and communication means such as the Internet may also be provided.

FIG. 3A shows a construction diagram of the computer system comprising a terminal 301, a doping system 302, a computer 311, and a measuring instruments 321.

The terminal 301 comprises a instrument to input production conditions of semiconductor devices, design conditions of devices, and the like. As the terminal 301, a personal digital assistant (PDA), a computer, or the like can be used. The terminal 301 and the doping system 302 are provided at a place (a clean room, for example) to produce devices.

The computer 311 comprises a apparatus (computing apparatus 312) for computing the dose amount from the threshold voltage (Vth), the flat band voltage (Vfb), and the dopant density (Nc) that are input from a measuring instrument 321, and a device (setting device 315) for setting the dose amount obtained from the computing apparatus to doping system. The computer 311 comprises an output apparatus that allows to output of the dose amount by printing or displaying.

The computer 311 also may comprise a storage apparatus 313 for recording respective threshold voltages (Vth), flat band voltages (Vfb), dopant densities (Nc), which are obtained from the computing apparatus 312, production conditions of semiconductor devices, design conditions of devices, and the like.

Further, the computer 311 may comprise a determining apparatus 314 for selecting a proper dose amount from the storage instrument 313, according to the production conditions of semiconductor devices, the design conditions of devices, and the like. More preferably, conditions unique to each doping system are stored in the storage instrument 313 so that a best dose amount can be selected by the determining apparatus 314.

The computer 311 may be installed at a place to produce devices or a different place. In case of installing the computer 311 at the different place, each condition which is input at the terminal 301 may be input to the determining apparatus 314 through a network.

The measuring instrument 321 measures Vg-Id characteristics, which are the electric characteristics of a device, and obtains the threshold voltage (Vth) and the flat band voltage (Vfb). Further, SIMS analysis measurement is carried out to obtain the dopant density (Nc) of the device. The measuring instrument 321 may be installed at the place to produce devices or a different place. In case of installing the measuring device 321 at the different place, each result by the measuring device may be input to the computing instrument 321 through the network. The measuring device 321 and the computer 311 may be installed at the same place.

Next, the two routes of the system will be described, using FIG. 3B. Through the route (i), information flows into the doping system, and through the route (ii), information selected from the storage instrument 313 by the determining apparatus 314 flows into the doping system.

On the route (i), the dopant density (Nd) is obtained from the threshold voltage (Vt) and the flat band voltage (Vfb) of the device which are input to the computing apparatus 312. From the dopant density (Nc), the dopant activation rate is derived from the storage instrument. Further, from the dopant activation rate, the dose amount is derived from that. Then, the dose amount is set by the setting apparatus 315, and the dose amount is output to the doping system.

On the route (ii), from the database stored in the storage instrument 313, a dopant activation rate that fits the production conditions of the semiconductor device and the design conditions of the device is selected by the determining apparatus 314, and the dopant density (Nc) is determined.

Further, the dose amount for obtaining a predetermined dopant density sometimes changes with each doping system. In this case, conditions peculiar to each doping system that are stored in the storage instrument 313 are referred to, and thus an optimum dose amount for obtaining the above determined dopant density is determined and output to the doping system.

Figure 12:
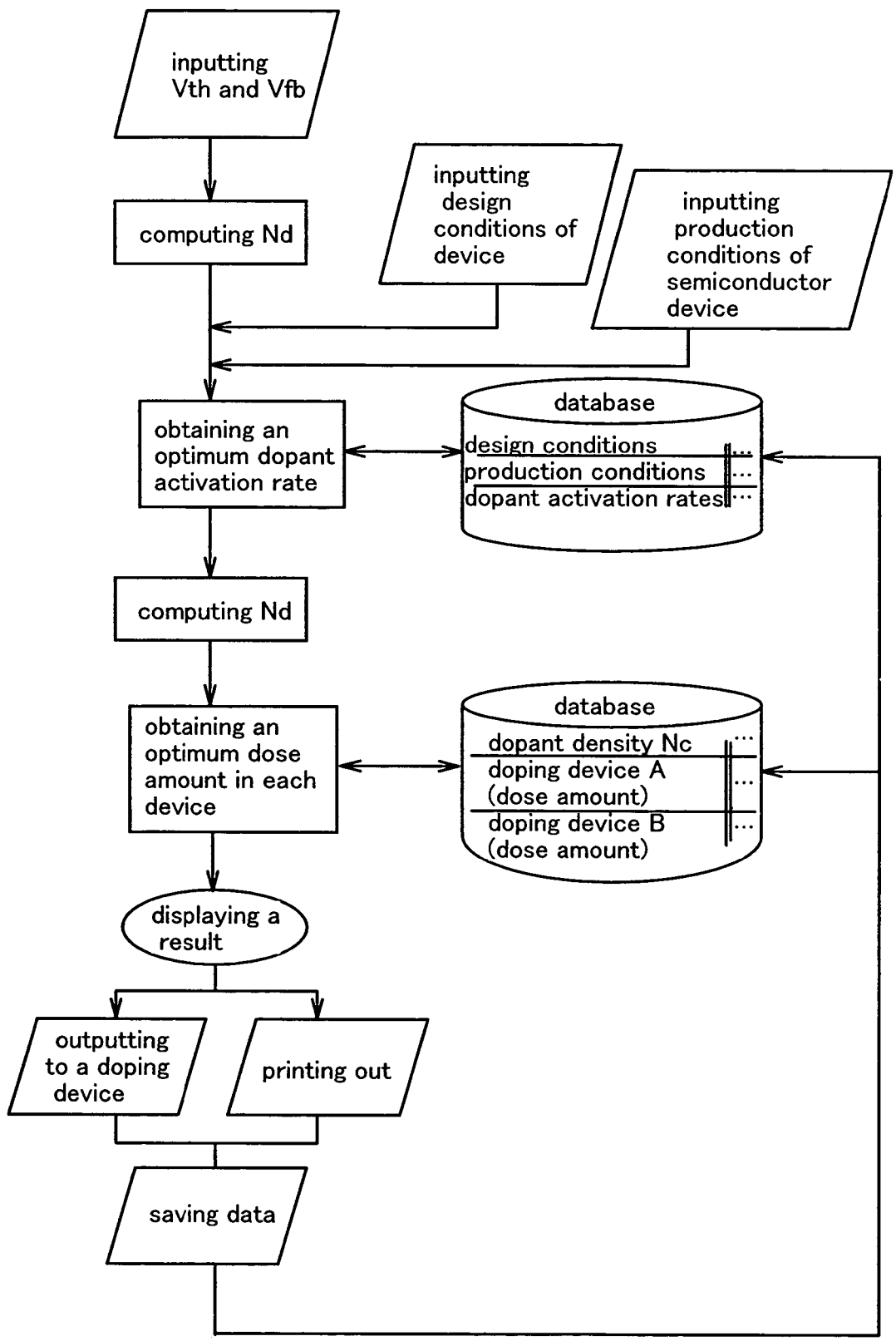
FIG. 12 is a flowchart of a software routine according to the invention.

Next, as an example of a routine flow of a dose amount control program, the routine described above with (ii) in FIG. 3B will be now described with reference to FIG. 12.

First, Vth and Vfb which are obtained from the electric characteristics of the measured semiconductor device are input to calculate the doping density (Nd) from theoretical formulas according to the invention. Also, the design conditions (the portion to be formed, the construction of the semiconductor device, and the like) of devices and the production conditions (activation conditions of the semiconductor film, etc.) of the semiconductor device are input. Then, an optimum dopant activation rate for the design conditions of the device is computed, taking the dopant density (Nd) and the production conditions of the semiconductor device into account. At this time, the design conditions of devices, the production conditions of semiconductor devices, and the conditions of the dopant activation rates, which are stored in the database, are referred to, and thus the optimum dopant activation rate is determined.

Next, according to the dopant activation rate, the added dopant density (Nc) is computed. The doping system needs to be stable enough to be able to add a certain dose amount, and conditions that enable each doping system to add a predetermined dose amount may be databased. That is, the database in which the conditions of each doping system are stored is referred to, and thus the dose amount for obtaining the predetermined dopant density is determined.

The result of the obtained dose amount is displayed. Then, the dose amount may be output to the doping system, printed out, or output in another way. Further, data including the obtained dose amount is saved and stored in the database.

By the computer system, as described above, for controlling the dose amount, the dose amount can be efficiently determined. Further, independently of the experience of the executor, the dose amount can be obtained in a short time with a constant result.

Embodiment 1

In the present embodiment, a result of obtaining the dopant activation rate in the channel region of a device will be described. Boron (B) is used as the dopant.

First of all, a cross-section (A) of a measurement sample and a cross-section (B) of a sample for SIMS analysis will be described with reference to FIGS. 4A and 4B.

As shown in (i) in FIG. 4A, a semiconductor film 401 is formed on an insulating substrate 400. The semiconductor film 401 is laser-crystallized, heat-crystallized, or crystallized using a method of crystallizing in which a metallic element that promotes crystallization is added. In the present embodiment, the semiconductor film is crystallized by heating.

As shown in (ii) in FIG. 4A, boron is doped into the crystallized semiconductor film 401. At this time, the dose amount is set in six conditions to form measurement samples 1 to 6 as shown in Table 1.

TABLE 1

| sample number | dose amount of boron ($/cm^2$) |
|---|---|
| 1 | $3.1 \times 10^{13}$ |
| 2 | $5 \times 10^{13}$ |
| 3 | $8 \times 10^{13}$ |
| 4 | $1.3 \times 10^{14}$ |
| 5 | $2 \times 10^{14}$ |
| 6 | $3.2 \times 10^{14}$ |

For the SIMS sample, after crystallization of the semiconductor film, boron is doped under conditions of $1 \times 10^{13}/cm^2$, 30 kV, and 5W without being patterned. Thus, the SIMS sample is completed.

Next, as shown in (iii) in FIG. 4A, the semiconductor film of only the measurement sample is patterned into a desired shape, and the dimensions are set to L/W=8/8 μm. Then, the semiconductor films of the measurement sample and the SIMS sample are covered by forming an insulating film 402.

Further, as shown in (iv) in FIG. 4A, a gate electrode is formed by laminating a first conductive film 403 and a second conductive film 404. Then, phosphorus (P) is added, with the gate electrode as a mask, and a source and drain region 405, a first low concentration impurity region 406, and a second low concentration impurity region 407 superimposing with the gate electrode are formed, thereby completing an n-channel type TFT.

Each sample 1 to 6 of the device and the SIMS sample may be formed on the same substrate or on different substrates. In case of forming the SIMS sample on a different substrate, a Si wafer may be used. If the doping system is stable, the SIMS sample may be produced and carry out SIMS analysis in advance. In other words, if implant conditions (GI film thickness, implant energy, etc.) are not changed for each substrate or each a Lot, it is not necessary to carry out SIMS analysis for each substrate or a Lot.

Further, Vg-Id characteristics of the samples 1 to 6 is measured. The result is shown in FIG. 9. The threshold voltages Vth (V) and the flat band voltages of the samples 1 to 6 are obtained from FIG. 9. The result is shown in Table 2.

TABLE 2

| sample number | Vth (V) | Vfb (V) |
| --- | --- | --- |
| 1 | 1.59 | −0.676 |
| 2 | 1.74 | −0.643 |
| 3 | 2.6 | −0.162 |
| 4 | 4.26 | 0.36 |
| 5 | 7.35 | 0.545 |
| 6 | 8.62 | 0.714 |

From the result, the relationship between the boron dose amount and the threshold voltage is shown in FIG. 5. It will be understood from FIG. 5 that as the boron dose amount increases, the threshold voltage rises. FIG. 5 shows, however, the relationship between the boron dose amount and the threshold voltage, but does not show the relationship between the activated boron concentration and the threshold voltage.

Figure 6:
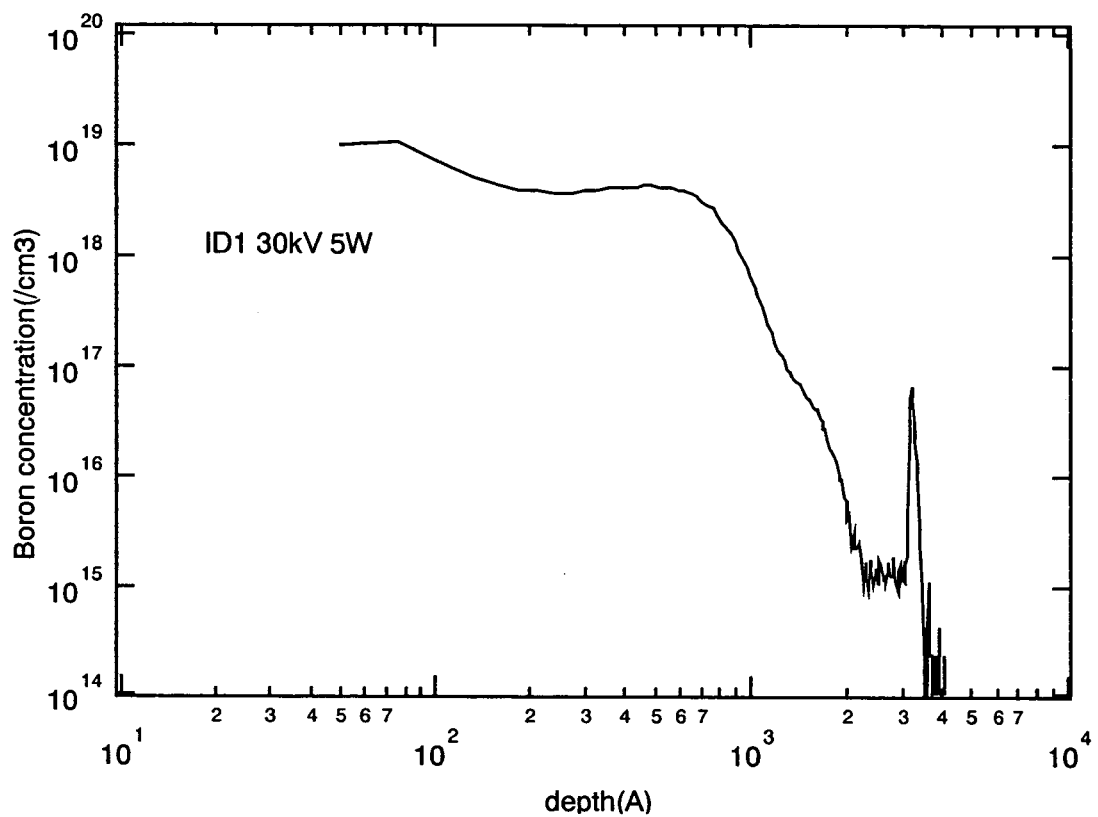
FIG. 6 is a diagram showing another experimental result according to the invention.

Next, the result of SIMS analysis for depth distribution of boron concentration in the SIMS sample is shown in FIG. 6. In the present embodiment, as the SIMS sample, a Si wafer formed with an insulating film 1 μm thereon is used, wherein the Si wafer is a different substrate from the measurement samples. Since the film thickness of the semiconductor film (Si film) of the SIMS sample is 50 nm, the boron density can be estimated as approximately $4 \times 10^{18}/cm^3$. Also, it can be assumed that the dose amount and the boron concentration obtained from SIMS are linearly proportional to each other. Therefore, boron concentrations, other than for the dose amount of $1 \times 10^{13}/cm^2$, can be simply estimated from the result in FIG. 6. For example, the concentration of boron which is present in the semiconductor film when doping in a dope amount of $5.0 \times 10^{13}/cm^2$ is calculated as $(5.0 \times 10^{13}/1.0 \times 10^{13}) \times 4 \times 10^{18}/cm^3$.

Further, Table 3 shows, the results of the dopant density Nd obtained such that the threshold voltage and the flat band voltage obtained from the Vg-Id curve are given to the theoretical formula, the dopant density Nc obtained from SIMS analysis, and the dopant activation rate (Nd/Nc).

TABLE 3

| sample number | Nd[calculation](/cm$^3$) | Nc[SIMS](/cm$^3$) | activation rate (%) |
| --- | --- | --- | --- |
| 1 | $9.76 \times 10^{15}$ | $1.24 \times 10^{19}$ | 0.0787 |
| 2 | $1.11 \times 10^{16}$ | $2.00 \times 10^{19}$ | 0.0555 |
| 3 | $1.60 \times 10^{16}$ | $3.20 \times 10^{19}$ | 0.05 |
| 4 | $3.61 \times 10^{16}$ | $5.20 \times 10^{19}$ | 0.0694 |
| 5 | $1.22 \times 10^{17}$ | $8.00 \times 10^{19}$ | 0.153 |
| 6 | $1.67 \times 10^{17}$ | $1.28 \times 10^{20}$ | 0.13 |

Figure 7:
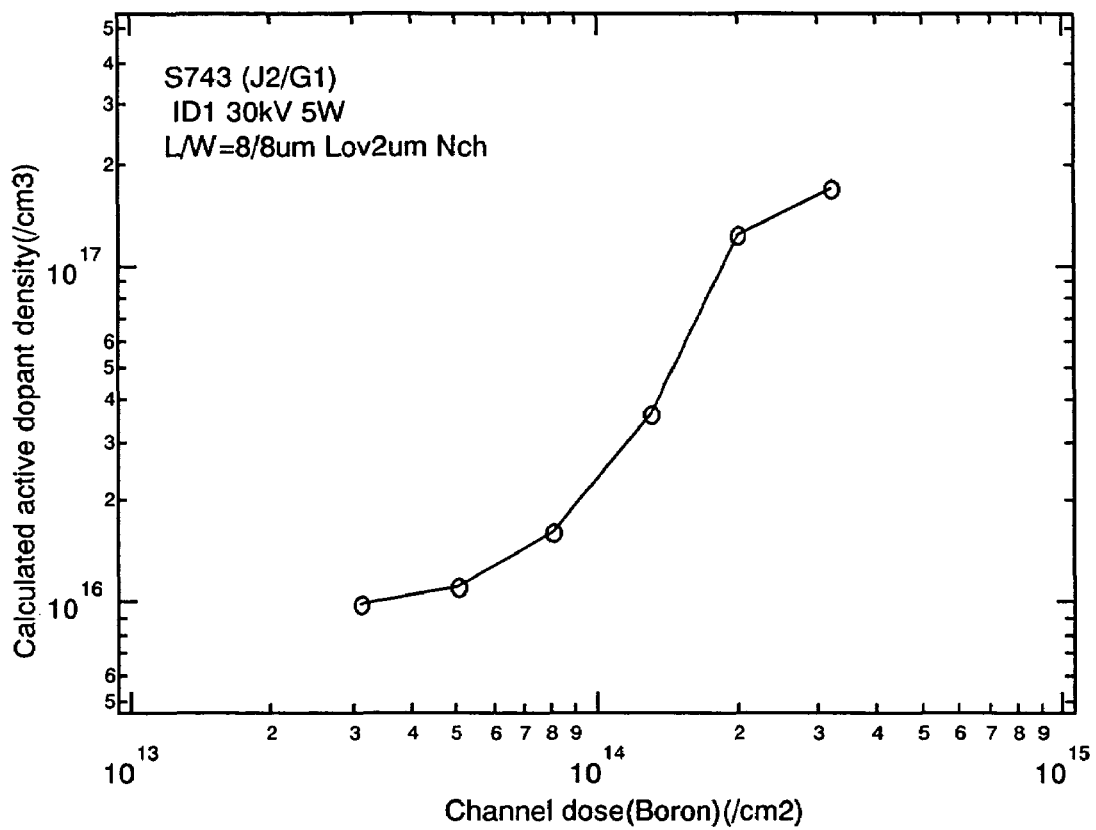
FIG. 7 is a diagram showing another experimental result according to the invention.

From Table 3, the relationship between the dose amount and the activated dopant density (Nd) is shown in FIG. 7. It will be understood from FIG. 7 that the relationship between the dose amount and the activated dopant density is not linear. This shows that the dopant activation rate changes with the dose amount.

Figure 8:
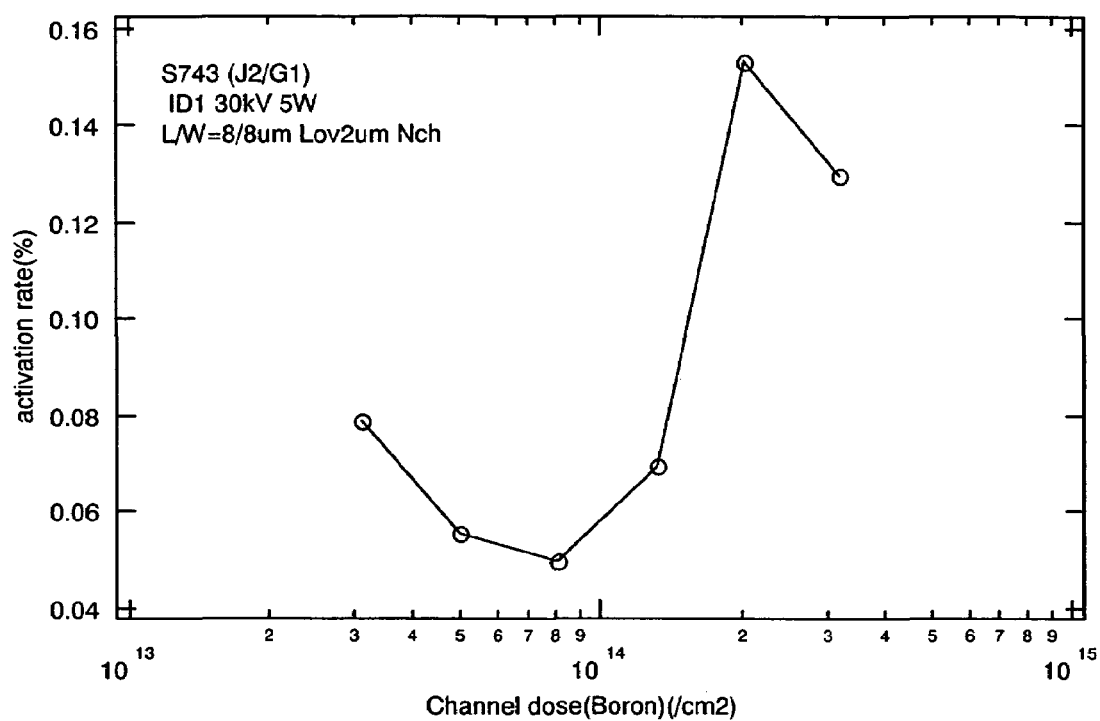
FIG. 8 is a diagram showing another experimental result according to the invention.

Further, FIG. 8 shows the relationship between the dose amount and the dopant activation rate. It will be understood from FIG. 8 that the dose amount and the dopant activation rate are not linearly proportional. Also, regions where if the dose amount is increased, the activation rate is reduced can be seen.

In general, the higher the defect density in the film, the lower the activation rate. Therefore, it can be understood that since the rate of the introduced defect for the dose amount becomes higher in some region, the activation rate drops. If the dose amount is increased more, it can be understood that the activation rate rises because the effect by the high added dopant density is greater than the effect by the introduced defect density.

In such a manner, a relative comparison between the defect density in the semiconductor films from the dopant activation rate and is possible.

As described above, since there is no special relationship between the dose amount and the dopant activation rate, it is necessary to obtain the dopant activation rate for each change of the dose amount or the process, and control the threshold voltage. As described in the embodiment mode, it is also possible to estimate the threshold voltage and the flat band voltage from the dopant activation rate, and estimate the added impurity amount which is obtained from SISM analysis.

The invention can be applied to FETs in any structure, for example, Single drain structures, Gold structures, LDD structures, Dual Gate structures, and Double Gate structures.

As the gate insulating film, a monolayer film such as a thermal oxide film, a TEOS film, a SiON film, a nitride film or a multi-layer film by a combination thereof can be used. As the gate electrode, a monolayer film of Poly-Si, tungsten, aluminum, titan, tantalum, or the like, or a multi-layer film by a combination thereof can be used.

As a substrate to form the semiconductor film, a semiconductor wafer, glass, or quartz can be used. Any of single crystalline, polycrystalline, and amorphous can be applied to the semiconductor film. To the material of the semiconductor film, an element such as Si or Ge, or a compound semiconductor such as GaAs, InP, SiC, ZnSe, or GaN can be applied. Further, a mixed crystalline semiconductor such as SiGe, or $Al_xGaAs_{1-x}$ can also be applied.

Further, the invention can be applied to any dopant that acts as an n-type or p-type donor (Phosphorus, Arsenide, Sb), or an n-type or p-type acceptor (Boron, Sn, Al, etc.). Although in the embodiment, the activation rate of boron, which is a p-type dopant, is obtained using a N type TFT, the activation rate of an n-type dopant can also be obtained using an P type FET. For example, if an n-type dopant which acts as a donor is implanted into the active layer, and the threshold voltage and the flat band voltage are obtained from the Vg-Id curve of a p-type FET, the activation rate of the n-type dopant can be obtained as well.

Embodiment 2

In the present embodiment, for measurement samples 1 to 5, there is shown a result of an in-plane distribution of the threshold voltage (Vth), the flat band voltage (Vfb), and the dopant density (Nd) which is obtained from theoretical formulas according to the invention.

The in-plane distribution shows a dispersion of the threshold voltage (Vth), the flat band voltage (Vfb), and the dopant density (Nd) in the same substrate. First of all, numbers (1,1), (1,2), . . . are given to the devices formed on the same substrate. The dispersion of the devices of the respective numbers is obtained.

Figure 10:
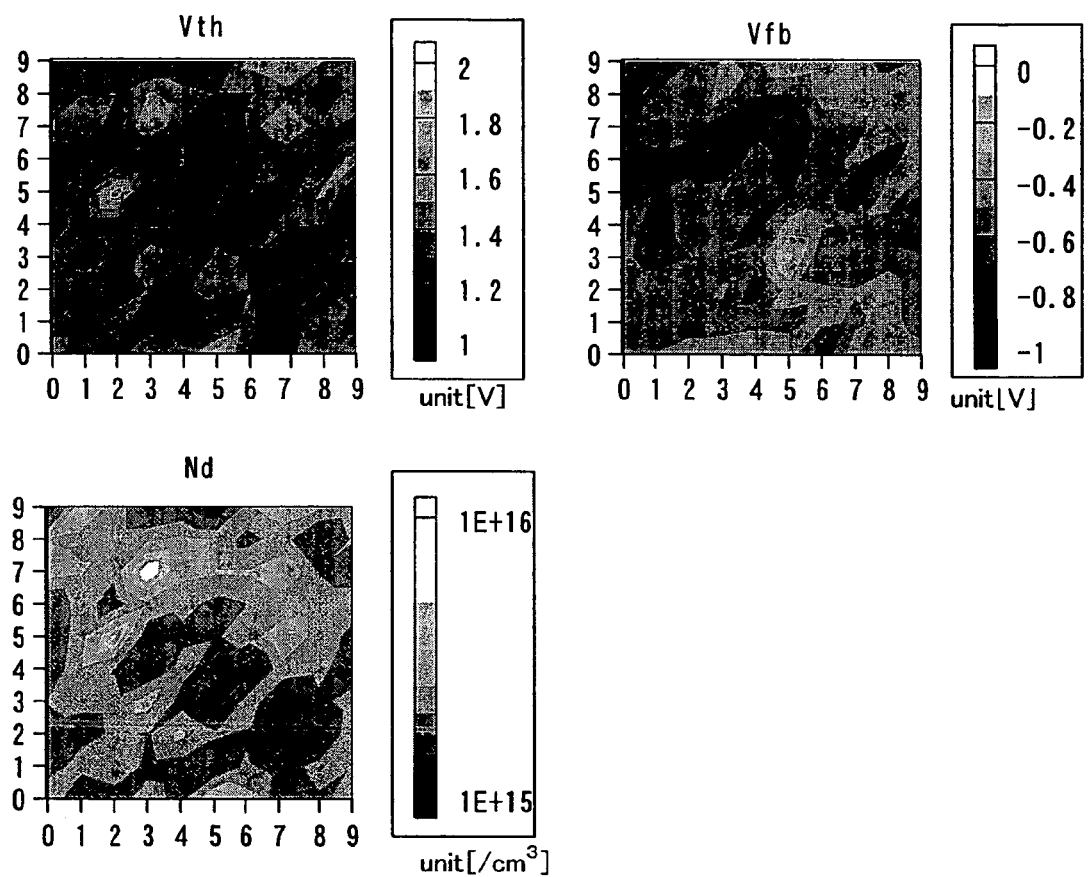
FIG. 10 is a diagram showing another experimental result according to the invention.
Figure 11:
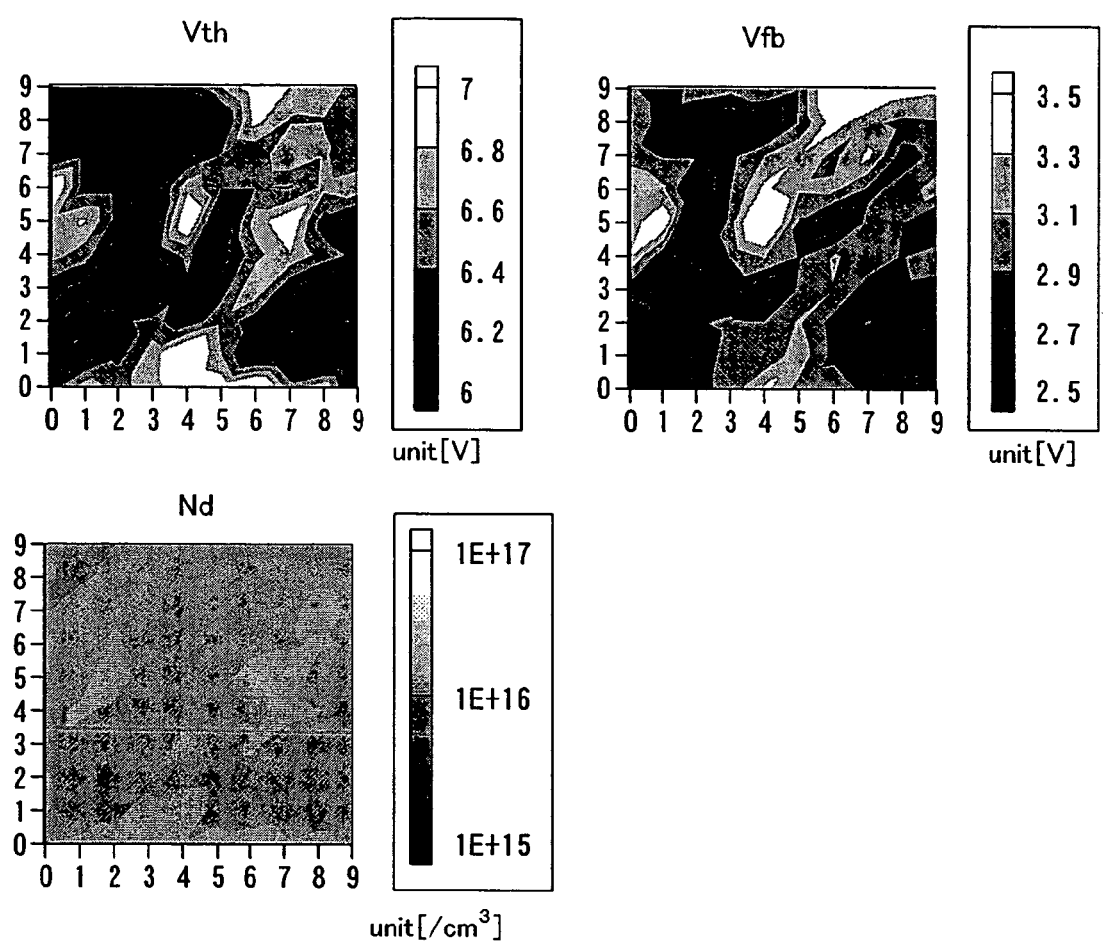
FIG. 11 is a diagram showing another experimental result according to the invention.

FIG. 10 shows the result with the sample 1, and FIG. 11 shows the result with the sample 5. X axis and Y axis represent the numbers ((0,0) to (9,9)) given to the devices in a sample, and the devices are provided in a quantity of 10×10.

As described above, according to the invention, even the dispersion of the dopant density in a microscopic region in a microscopic region in a substrate can be evaluated, which is not possible by known methods.

By the new evaluation method of semiconductor devices according to the invention, the dopant activation rate of a device can easily be obtained. The invention provides a method of producing a device which is performed with proper threshold voltage control, that is, dose amount control according to the obtained dopant activation rate.

Further, the invention provides a design management system of a device for efficiently designing a device having desired characteristics by setting the doping amount of a doping system to a proper value.

Still further, the invention provides a program or a computer-readable medium by which a dose amount of a certain result can be obtained in a short time, independently of the experience of the executor.

What is claimed is:

1. An evaluation method of a semiconductor device comprising:
   measuring a drain current characteristics of a gate voltage of the semiconductor device;
   obtaining a threshold voltage and a flat band voltage from the drain current characteristics of the gate voltage of the semiconductor device;
   obtaining an activated dopant density from the threshold voltage and the flat band voltage; and
   obtaining an added dopant density in the semiconductor device.

2. The evaluation method of the semiconductor device according to claim 1, wherein the added dopant density in the semiconductor device is obtained by secondary ion mass spectrometry analysis.

3. The evaluation method of the semiconductor device according to claim 1, wherein the activated dopant density and the added dopant density in a channel region of the semiconductor device are obtained.

4. The evaluation method of the semiconductor device according to claim 1, wherein the activated dopant density and the added dopant density in an impurity region of the semiconductor device are obtained.

5. The evaluation method of the semiconductor device according to claim 1, further comprising obtaining a dopant activation rate from the activated dopant density and the added dopant density.

6. The evaluation method of the semiconductor device according to claim 5, further comprising determining a dose amount from the dopant activation rate.

* * * * *

UNITED STATES PATENT AND TRADEMARK OFFICE
CERTIFICATE OF CORRECTION

| | |
|---|---|
| PATENT NO. | : 7,100,131 B2 |
| APPLICATION NO. | : 10/700719 |
| DATED | : August 29, 2006 |
| INVENTOR(S) | : Tatsuya Honda |

It is certified that error appears in the above-identified patent and that said Letters Patent is hereby corrected as shown below:

On Title Page
Item (73) Assignee:

"Semiconductor Energy/Laboratory Co., Ltd." should read --Semiconductor Energy Laboratory Co., Ltd.--.

Signed and Sealed this

Twenty-third Day of January, 2007

JON W. DUDAS
*Director of the United States Patent and Trademark Office*